United States Patent [19]

Kuo

[11] 4,122,232

[45] Oct. 24, 1978

[54] AIR FIRABLE BASE METAL CONDUCTORS

[75] Inventor: Charles Y. Kuo, Bayside, N.Y.

[73] Assignee: Engelhard Minerals & Chemicals Corporation, Iselin, N.J.

[21] Appl. No.: 570,231

[22] Filed: Apr. 21, 1975

[51] Int. Cl.$^2$ ............................................. H01B 1/02
[52] U.S. Cl. ........................................ 428/323; 252/512;
252/513; 252/518; 427/123; 428/325; 428/328;
428/433; 428/427; 428/428
[58] Field of Search ............... 428/323, 328, 433, 434,
428/427, 325, 428; 252/512, 513, 514, 518.1;
427/101, 376 A, 383 B, 123

[56] References Cited

U.S. PATENT DOCUMENTS

| | | | |
|---|---|---|---|
| 2,221,286 | 11/1940 | Hensel | 252/512 |
| 2,313,410 | 3/1943 | Walther | 252/512 |
| 2,886,476 | 5/1959 | Dumesnil | 428/450 |
| 3,151,386 | 10/1964 | Ingersoll | 252/512 |
| 3,622,523 | 11/1971 | Aurin | 252/514 |
| 3,627,573 | 12/1971 | Schottmiller | 252/512 |
| 3,647,532 | 3/1972 | Friedman | 252/512 |
| 3,824,127 | 7/1974 | Conwicke | 252/513 |
| 3,928,242 | 12/1975 | May | 252/513 |
| 3,948,812 | 4/1976 | Corren | 252/518.1 |
| 4,079,156 | 3/1978 | Youtsey | 427/96 |

Primary Examiner—Ellis Robinson

[57] ABSTRACT

A paste for forming a thick film conductor of a base metal on a non-conductive substrate comprises a base metal powder (particularly nickel) which ordinarily would oxidize when fired in air, boron powder and a vehicle. In one embodiment, the paste may also contain glass frit. By proper selection of the composition, in particular the amounts of boron and glass frit, a base metal conductor can be formed which strongly adheres to the substrate and has excellent conductive properties. Ranges of compositions are disclosed within which the pastes can be fired in air and produce conductive thick films and outside which conductive properties are inferior and/or the bond strength is unsatisfactory.

6 Claims, 2 Drawing Figures

AIR FIRABLE BASE METAL CONDUCTORS

BACKGROUND OF THE INVENTION

The broad field of the invention is that of thick film conductors for electronic applications. General reference works in this field include "Thick Film Microelectronics," Van Nostrand Reinhold Company, 1971. Thick films are usually formed by screen printing an ink or paste formulated from powdered metals on a non-conductive substrate, typically 96% alumina, and then dried to volatilize vehicle constituents and fired to sinter or fuse the constituents, bonding the film to the substrate. The firing is typically carried out in a belt furnace having a stream of air passing through it for oxidizing the vehicle and removing decomposition products. In the prior art such conductors are made of precious metals in particular gold, silver, platinum, and palladium. Since the amount of metal used in a single unit is not large, the high cost of the precious metals is offset by their advantageous physical properties. However, as the prices of precious metals have increased, interest in thick films made of base metals has increased, since costs can be reduced. Conductor pastes have been introduced to the market in recent years containing such base metals as copper and nickel. Such pastes have been covered in the technical press in such articles as those in Electronic Products, March, 1973, p. 162 and Circuit Manufacturing, November, 1972, p. 48. The pastes heretofore available required firing in a special inert or reducing atmosphere, typically hydrogen. The additional expense and difficulty of such firing makes the development of base metal conductor pastes which can be fired in air or other oxygen containing atmosphere of particular interest. The present invention satisfies that need.

SUMMARY OF THE INVENTION

A thick film conductor may be formed on a non-conductive substrate from a paste comprising in its broadest embodiment a base metal powder which would oxidize upon firing in the presence of air to become substantially non-conductive, sufficient boron powder to prevent oxidation of said base metal powder, and a vehicle. In an alternative embodiment the paste may also contain glass frit. The base metal and boron particles used are generally less than 325 mesh in size to assure satisfactory screen printing. When used, the glass frit particles are preferably in the sub-micron range, although they may be larger, up to 325 mesh as a maximum. A number of metals which otherwise would oxidize upon firing in air may be applied as conductive films by the method of the invention, in particular conductor films of nickel, cobalt, and copper have been made. In the preferred embodiment, the paste comprises between 50–80 percent by dry weight of nickel powder, between 5 and 20 percent by dry weight of boron powder, and up to 15 percent by dry weight of glass frit, and sufficient vehicle to provide a suitable viscosity.

In a process for forming an air firable base metal conductor the paste as described above is mixed in the desired proportions and then applied on a non-conductive substrate by screen printing, although brushing, dipping, or other techniques, such as used in the graphics industry could be used. After application, the paste is dried at an elevated temperature to evaporate the volatile components of the vehicle. Thereafter, the dried paste is fired in air to fuse or sinter the constituents and to bond the film to the substrate, while the boron prevents oxidation of the metal and preserves its conductivity. The resulting film is well bonded and is electrically conductive, making it suitable for use in electronic applications.

DESCRIPTION OF THE PREFERRED EMBODIMENTS

There are two principal problems which must be solved in order to produce a satisfactory base metal conductor on a non-conductive substrate: first, obtaining a strong bond between the conductor and the substrate, which is essential for electronic applications; second, avoiding the loss of the base metal's conductivity by oxidation. When fired in air, many base metals are rapidly oxidized, destroying their conductive properties. For example, although nickel has good conductive properties, it has not been heretofore possible to apply it as a conductor on a non-conductive substrate without firing in an inert atmosphere or in a reducing gas such as hydrogen. It has been found that addition of powdered boron to base metal powders will prevent the tendency of base metals to oxidize, permitting the paste to be fired in air. However, it has been found also that the range of boron composition is critical. If too little is used, say less than about 4 percent (dryweight), the nickel is oxidized and the conductivity is no longer adequate for electronic applications. On the other hand, should the quantity be too high, beyond approximately 50% (dryweight) then boron migrates to the surface of the paste and acts as an insulator, preventing the resulting thick film from serving as an electrical conductor.

Although in the prior art boron has been used occasionally to prevent oxidation, typically it has been used where its insulating character is desirable, not detrimental. Such a use is shown in U.S. Pat. No. 2,886,476 where boron is mixed with carbon to form carbon resistors. Another application is disclosed in U.S. Pat. No. 3,622,523 where boron is used to reduce oxides of vanadium and, in combination with noble metals and a vehicle, produces a film which provides overload protection by being transformed from a semi-conductor to a conductor when an overvoltage surge is experienced.

In the discussion which follows, the preferred base metal, nickel, will be the principal subject. Other base metals may also be successfully employed in air-firable base metal conductor pastes, in particular cobalt and copper, may be used.

Figure 1:
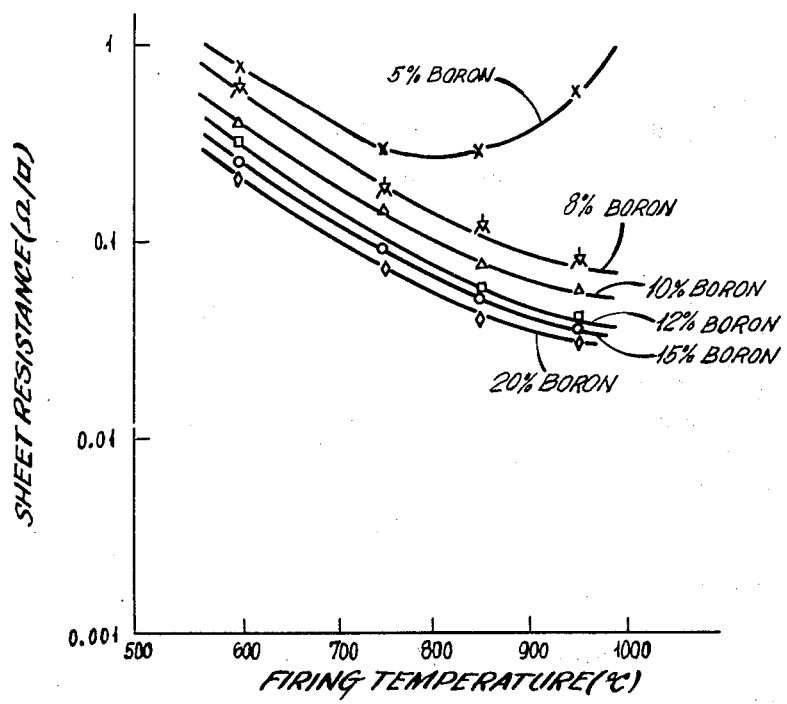
FIG. 1 illustrates the effect of varying the amount of boron powder added to the conductive paste of the invention.

The effect of increasing the boron content of the paste is to increase the conductivity of the film, as will be seen in FIG. 1. Sheet resistance, which is a standard measure of conductivity used in the electronics industry, is plotted versus temperature used in firing the printed film. A range of boron content for such pastes is shown by a family of curves, each for a specific boron concentration. It will be clear that a range of boron contents may be used, depending upon the sheet resistance which is desired. A value below about one ohm per square is typical of a thick film conductor. While a range of 5–20 percent boron (dry weight) is preferred, the broader range of 4–50 percent has been found to produce some beneficial effects. As noted previously, at higher concentrations the boron covers the film and useful conductivity is lost. Below 4%, the sheet resistance is higher than is normally acceptable for electronic applications (above 1 ohm/square). As can be seen, the use of 5% boron exhibits a less desirable character since the sheet resistance in ohms per square does not decrease uniformly with increasing firing temperature as it does in films made from higher boron content pastes. In fact, the 5% boron curve shows that resistance increases after a minimum point has been reached.

FIG. 1 also shows that when boron alone is added, the conductivity improves with increased firing temperature. Thus, a trade-off is possible between boron content and firing temperature to achieve a selected sheet resistance. For example, a 0.1 ohm/square sheet resistance may be obtained by firing a 20% boron paste at 700° C, a 10% boron paste at 800° C, or a 8% boron paste at 900° C. This effect may be usefully employed in commercial thick film production which is limited by firing capacity.

Figure 2:
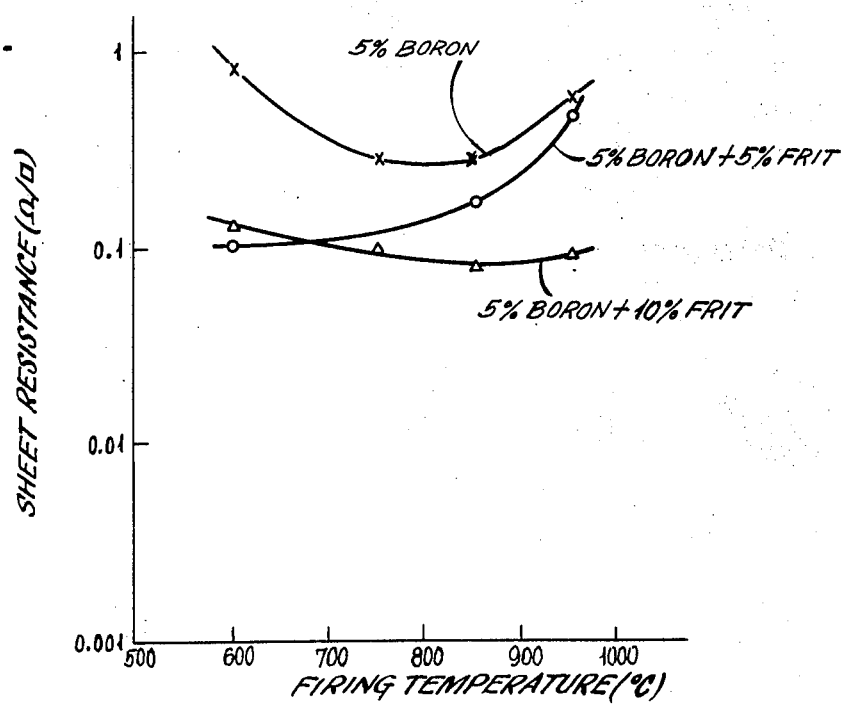
FIG. 2 illustrates the effect of adding glass frit to a base metal-boron paste.

In FIG. 2, sheet resistance is plotted versus firing temperature, but only 5% boron pastes are shown. While, as FIG. 1 shows, boron alone may be used to overcome the tendency of nickel to oxidize, it will be clear from the data plotted in FIG. 2 that the addition of relatively small quantities of glass frit has the desirable effect of lowering sheet resistance and straightening the sheet resistance versus firing temperature curve. Glass frit alone will not protect the nickel when no boron is used. The film adheres poorly and sheet resistance is very high. This curve straightening effected by glass frit addition is desirable in that it permits the firing of a given composition at various temperatures with little change in the resulting resistance, a very practical benefit for commercial production of electronic parts. Generally, up to 15 percent (dryweight) of glass frit is preferred; however, this may be extended to 20 percent frit before undesirable effects are observed, such as increasing sheet resistance due to the inherent electrical resistance of glass.

In the data plotted in FIGS. 1 and 2, the nickel powder used had a particle size between 2.9 and 3.6 microns. Its surface area was about 0.54 m$^2$/gram. Its bulk density was measured to be 1.6 gram/cc after tapping a 10 cc sample 1000 times to settle the powder. Powders which have particle sizes up to 325 mesh (44 microns) can be used, as limited by the ability to screen print a film. The nickel content of the finished paste will preferably be 50-80 percent (dryweight), but as little as 40 percent could be used before the sheet resistance of the thick film produced is too high (above 1 ohm/square).

The boron powder used in the pastes which gave the results plotted in FIGS. 1 and 2 had a particle size similar to that of the nickel powder. Its surface area was about 9.57 m$^2$/gram. Its bulk density (tapped) was about 0.65 grams/cc. Generally, amorphous boron is preferred although crystalline boron is usable. Either the commercial type A (90-92 percent purity) or type B (95-97 percent purity) have been used and found satisfactory. Type B was used in the tests reported as FIGS. 1 and 2.

The glass frit used is preferably within the submicron size range but a large size up to 325 mesh could be used. Low melting point frits such as borosilicate glass (with or without lead) melting in the range of 350-700° C have been found satisfactory. Glass frits containing one or more of the group of oxides including calcium, strontium, barium, zinc, lithium, sodium and potassium oxides can also be used. For the tests reported in FIGS. 1 and 2, a lead borosilicate frit was used, having a softening point of 380° C and a coefficient of thermal expansion of 104 × 10$^{-7}$/° C.

The organic vehicles used to prepare the nickel conductive pastes have not been found to be critical within the paste composition ranges given. Any organic vehicle which can disperse the small particles can be used. Typically, they will consist of a thickener, e.g., ethyl cellulose, and a liquid carrier such as terpineol, pine oil, esters, alcohols, ketones, acetone, or other organic solvents. Optionally, stabilizing agents and wetting agents may also be used. The vehicle will ordinarily make up 15-40 percent by weight of the finished paste when used for screen printing, although as little as 10 percent is possible. The amount of vehicle will be varied to adjust the viscosity of the finished paste as required by the application technique to be used. Greater amounts of solvents will be typically used with brushing techniques. For illustration, a heavy paste with a viscosity about 250 poise is typically used for screen printing, while a thinner paste with a viscosity of about 20 poise is typically used for dipping or brushing applications.

The paste is prepared by mixing the powders of nickel and boron and the glass frit (if desired) with the organic vehicle by mechanical mixers. Following this, the mixture is roll milled by the conventional three-roll mill until the paste is uniform. The paste produced typically has a viscosity of about 250 ± 50 poise and a yield value of about 10,000 dyne per square centimeter as measured by a ShirleyFerranti cone-tye viscometer.

The paste is applied, typically by screen printing, onto a non-conductive substrate, which will typically be 96% alumina for electronic applications. A 200 mesh stainless steel screen was used in laboratory testing of the pastes of the invention. After screening, the resulting film is dried in air for about 15 minutes at 100° C to remove volatile materials in the paste. Following this, the dried film is fired in a muffle or belt furnace within the range of 600-1000° C for about a period usually ranging up to about 45 minutes. In accordance with conventional practice, air is passed through the furnace to oxidize the vehicle and to remove organic decomposition products which could contaminate the film.

The electrical performance of the resulting nickel conductor thick films is clearly seen from FIGS. 1 and 2. The resulting films not only exhibit satisfactory electrical conductivity (i.e., low sheet resistance) but they are extremely well bonded to the substrates. A pull strength of greater than 3000 lbs. per square inch has been obtained, using a typical pull test in which a rivet is soldered to the conductor and pulled until the film is pulled away from the substrate. Although adhesion depends upon the processing conditions, such as temperature and time of firing, substrate material, flux used, etc., it can be generally stated that improved adhesion is obtained with increasing firing temperature and with increased glass frit content.

Another desirable characteristic of nickel conductors formed from the paste of the invention is their resistance to leaching during soldering operations. Such leaching is a problem with precious metal conductors, which tend to alloy at the temperature of the solder bath. However, nickel is highly resistant to such leaching away. It has been also found that the resulting nickel conductor can be readily soldered and attached to other electronic components, which obviously is important for commercial electronic applications.

Although the above description is related to the preferred base metal, nickel, certain other base metals which would otherwise oxidize upon firing in air, such as copper and cobalt may be applied in a similar manner. The following examples illustrate the use of copper and cobalt in forming base metal conductive thick films.

EXAMPLE 1

COBALT CONDUCTOR PASTE

A cobalt conductor paste is formulated by mixing 75 weight % of cobalt powder (less than 325 mesh) with 17.5 weight percent of boron powder (type B 95–97% purity and a sub-micron particle size), 7.5 weight percent glass frit (lead borosilicate and a sub-micron particle size), and sufficient vehicle to produce a paste which can be satisfactorily screen printed. After firing (peak temperature 600° C for 10 minutes) in a belt furnace while being exposed to air passed through the furnace, the sheet resistance of the resulting film is between 0.1 and 5 ohms per square.

EXAMPLE 2

COPPER CONDUCTOR PASTE

A copper conductor paste is formulated by mixing 84 weight percent copper powder (less than 325 mesh) with 6 weight percent of boron powder (type B, 95–97% purity and a sub-micron particle size), 10 weight percent glass frit (lead borosilicate and a sub-micron particle size), and sufficient vehicle to produce a paste which can be satisfactorily screen printed. After firing (peak temperature 600° C for 10 minutes) in a belt furnace while being exposed to air passed through the furnace, the sheet resistance of the resulting film is between 1 and 10 ohms per square.

In addition, nickel-silver mixtures have been found to give thick film satisfactory sheet resistances for use as electronic conductors.

The foregoing description of the preferred embodiments is for illustration of the application of the invention. It should not be considered to limit the scope of the invention, which is defined by the claims which follow.

What is claimed is:

1. A method of forming a base metal thick film electrical conductor having a sheet resistance less than about 1 ohm/square on a non-conductive substrate comprising:
   (a) mixing a paste comprising (i) a base metal powder which oxidizes upon firing in the presence of air and becomes substantially electrically non-conductive and selected from the group consisting of nickel, copper, cobalt and mixtures thereof, said powder having a particle size less than 325 mesh and a concentration between 50 and 80 percent dry weight of base metal and boron, (ii) boron powder in an amount sufficient to prevent oxidation of said base metal powder during firing of said paste in air, said boron powder having a particle size less than 325 mesh and a concentration between 4 and 50 percent by dry weight of base metal and boron, (iii) sufficient vehicle to produce a paste suitable for application on said substrate, and (iv) up to about 20 percent of glass frit by dry weight relative to the total of base metal, boron, and glass frit, said glass frit having a particle size of less than 325 mesh;
   (b) applying said paste of (a) onto said non-conductive substrate;
   (c) air-drying the applied paste of (b) at an elevated temperature to remove volatile materials in said vehicle;
   (d) firing the air-dried paste of (c) in air to bond said powders to said substrate, said boron preventing oxidation of said base metal powder, thereby forming a base metal thick film electrical conductor having a sheet resistance less than 1 ohm/square on said substrate.

2. The method of claim 1 wherein said paste of (a) further comprises silver.

3. A paste for forming a thick film electrical conductor on a non-conductive substrate by firing at elevated temperatures in the presence of air comprising:
   (a) A base metal powder which oxidizes upon firing in the presence of air and becomes substantially electrically non-conductive, selected from the group consisting of nickel, copper, cobalt and mixtures thereof, said powder having a particle size less than 325 mesh and a concentration between 40 and 80 percent by dry weight of base metal and boron;
   (b) an operable amount of boron powder whereby oxidation of said base metal powder of (a) is prevented during firing of said paste in air and thereby producing an electrically conductive film, said boron powder having a particle size less than 325 mesh and a concentration between 4 and 50 percent by dry weight of base metal and boron;
   (c) a vehicle; and
   (d) up to about 20 percent of glass frit by dry weight relative to the total of base metal, boron and glass frit having a particle size of less than 325 mesh.

4. The paste of claim 3 wherein the vehicle content is within the range of 10 to 40 percent by dry weight.

5. The paste of claim 3 further comprising silver.

6. A base metal thick film conductor on a non-conductive substrate characterized by having a sheet resistance less than about 1 ohm/square and formed from:
   (a) between 40 and 80 percent by dry weight of a base metal powder relative to the total of base metal and boron which oxidizes upon firing in the presence of air and becomes substantially electrically non-conductive and selected from the group consisting of nickel, copper, cobalt and mixtures thereof;
   (b) between 4 and 50 percent by dry weight of boron powder relative to the total of base metal and boron; and
   (c) up to about 20 percent by dry weight of glass frit relative to the total of base metal, boron and glass frit; said conductor formed by firing in the presence of air a paste comprising powders having particles less than 325 mesh of said base metal powder, boron and glass frit mixed with a suitable vehicle to produce a conductor having a sheet resistance less than about 1 ohm/square.

* * * * *